US012766830B2

(12) United States Patent
Fukaya

(10) Patent No.: US 12,766,830 B2
(45) Date of Patent: Oct. 20, 2026

(54) ACTUATOR, ELEMENT SUBSTRATE, AND LIQUID DISCHARGING HEAD

(71) Applicant: CANON KABUSHIKI KAISHA, Tokyo (JP)

(72) Inventor: Youichi Fukaya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 18/790,188

(22) Filed: Jul. 31, 2024

(65) Prior Publication Data

US 2025/0050634 A1 Feb. 13, 2025

(30) Foreign Application Priority Data

Aug. 8, 2023 (JP) ................................ 2023-129181

(51) Int. Cl.

| | |
|---|---|
| ***B41J 2/045*** | (2006.01) |
| ***B41J 2/14*** | (2006.01) |
| ***H10N 30/87*** | (2023.01) |
| ***H10N 30/88*** | (2023.01) |

(52) U.S. Cl.

CPC ....... *B41J 2/04581* (2013.01); *B41J 2/14072* (2013.01); *B41J 2/14233* (2013.01); *H10N 30/87* (2023.02); *H10N 30/883* (2023.02); *B41J 2002/14241* (2013.01); *B41J 2002/1425* (2013.01)

(58) Field of Classification Search

CPC ................ B41J 2/04581; B41J 2/14072; B41J 2/14233; B41J 2002/14241; B41J 2002/1425; B41J 2202/11; B41J 2002/14491; H10N 30/87; H10N 30/883; H10N 30/2047; H10N 30/875

See application file for complete search history.

(56) References Cited

U.S. PATENT DOCUMENTS

2007/0091149 A1* 4/2007 Yazaki ................ B41J 2/14233 347/68
2020/0061996 A1* 2/2020 Tanaka .................. B41J 2/1632
2021/0078331 A1* 3/2021 Giusti .................... B41J 2/1629

FOREIGN PATENT DOCUMENTS

JP 2007-281033 A 10/2007

* cited by examiner

*Primary Examiner* — Henok D Legesse
(74) *Attorney, Agent, or Firm* — Venable LLP

(57) ABSTRACT

An actuator includes a diaphragm, a piezoelectric element that includes a first electrode layer that is in contact with the diaphragm, a second electrode layer, and a piezoelectric layer that has a first end and a second end, an electrode member that is connected to the second electrode layer at the first end side of the piezoelectric layer, and a sealing film that covers at least part of the piezoelectric element and in which a recessed portion is formed between the first end and the second end. In the first direction, a distance from the second end of the piezoelectric layer to an end of the recessed portion on the second end side is longer than a distance from the first end of the piezoelectric layer to an end of the recessed portion on the first end side.

15 Claims, 8 Drawing Sheets

X
Y
Z
B
102
108
110
110a
110b
111
112
114
115
121
122
109
109a
200
201
207
208
209
210
210a
210b
211
211a
211b
211c
d1
d2

ACTUATOR, ELEMENT SUBSTRATE, AND LIQUID DISCHARGING HEAD

BACKGROUND OF THE INVENTION

Field of the Invention

The present disclosure relates to an actuator, an element substrate provided with the actuator, and a liquid discharging head provided with the element substrate.

Description of the Related Art

Actuators that use piezoelectric substances, the shape of which changes, when an electric field is provided thereto are applied in small-scale speakers and hard disk drives, printers (liquid discharging devices), and so forth, as means for finely and accurately moving or vibrating objects. For example, a configuration is known, which is provided with a liquid discharging head and which discharges liquid by an actuator having a piezoelectric film, as a liquid discharging device.

Japanese Patent Application Publication No. 2007-281033 discloses a configuration of a liquid discharging head including an actuator that is made up of a piezoelectric element made up of a piezoelectric film and an electrode, and a sealing film that protects the piezoelectric element. Recessed portions are formed in the sealing film of the actuator, in a longitudinal direction of the piezoelectric element, in order to secure a sufficient amount of displacement of the piezoelectric element.

SUMMARY OF THE DISCLOSURE

However, in the above-described configuration, electrode pads (lead electrodes) are formed above the piezoelectric film at one end portion in the longitudinal direction of the piezoelectric film, and electrode pads are not formed over the piezoelectric film at the other end portion on an opposite side from the one end portion. Electrode material of electrode pads and so forth can suppress displacement of the piezoelectric element similarly to a sealing film. Accordingly, if a distance from one end of the piezoelectric film to one end of the recessed portions in the longitudinal direction of the piezoelectric film, and a distance from the other end of the piezoelectric film to the other end of the recessed portions, are set to be substantially equivalent, difference in amount of displacement is created between both end portions in the longitudinal direction of the piezoelectric element. In this case, at the end portion on the side where the amount of displacement is great, i.e., at the end portion where the electrode pads are not formed over the piezoelectric film, electrodes may peel loose from the piezoelectric film, the piezoelectric film may be destroyed, and so forth, thereby damaging the actuator.

The present disclosure has been made in consideration of the forgoing issue, and accordingly an object thereof is to provide an actuator in which damage of the piezoelectric element is suppressed.

In order to achieve the above object, an actuator according to the present disclosure includes:

- a diaphragm that has a first face and that is provided to be capable of vibrating;
- a piezoelectric element that includes a first electrode layer that is in contact with the first face, a second electrode layer, and a piezoelectric layer that has a first end in a first direction parallel to the first face and a second end on an opposite side to the first end, the piezoelectric element being provided on the first face, with the first electrode layer, the piezoelectric layer, and the second electrode layer being stacked in that order in a second direction perpendicular to the first face;
- an electrode member that is connected to the second electrode layer at the first end side of the piezoelectric layer; and
- a sealing film that covers at least part of the piezoelectric element, and in which a recessed portion that is recessed in the second direction is formed between the first end and the second end, wherein
- in the first direction, a distance from the second end of the piezoelectric layer to an end of the recessed portion on the second end side is longer than a distance from the first end of the piezoelectric layer to an end of the recessed portion on the first end side.

According to the present disclosure, an actuator can be provided in which damage of a piezoelectric element is suppressed.

Further features of the present disclosure will become apparent from the following description of exemplary embodiments with reference to the attached drawings.

DESCRIPTION OF THE EMBODIMENTS

Hereinafter, a description will be given, with reference to the drawings, of embodiments (examples) of the present disclosure. However, the sizes, materials, shapes, their relative arrangements, or the like of constituents described in the embodiments may be appropriately changed according to the configurations, various conditions, or the like of apparatuses to which the disclosure is applied. Therefore, the sizes, materials, shapes, their relative arrangements, or the like of the constituents described in the embodiments do not intend to limit the scope of the disclosure to the following embodiments.

The present disclosure is particularly suitable as a liquid discharging head provided to a liquid discharging device that discharges liquid onto a medium such as paper or the like. An embodiment will be described below in which the present disclosure is applied to a liquid discharging head, which is an ink jet head that discharges ink onto a recording medium to record images on the recording medium, by driving actuators provided on an element substrate. However, the present disclosure is also applicable to ink jet heads that discharge liquid other than ink, and other devices as well.

In the following description, the term "piezoelectric element" indicates a portion including an entirety of a lower electrode and an upper electrode, formed on a piezoelectric film, in a perpendicular direction to the face of the film. Additionally, an arrangement in which an insulating form, an upper electrode pad, and a sealing film in which recessed portions are formed, are provided on a piezoelectric element, may be referred to as "piezoelectric element" for the sake of simplicity.

First Embodiment

Element Substrate

A configuration of an element substrate 10 according to a first embodiment of the present disclosure will be described first. The element substrate 10 is an element substrate in which are formed a plurality of discharge orifices 101 for discharging ink, and channels communicating with the discharge orifices 101, and is provided in an ink jet head. The plurality of discharge orifices 101 are arrayed in line in an array direction, and the discharge orifices 101 are formed on the same plane. Hereinafter, the array direction of the discharge orifices 101 will be described as a Y direction, a direction in which the discharge orifices 101 discharge ink as a Z direction, and a direction orthogonal to the Y direction in the plane of a discharge orifice face where the discharge orifices 101 are formed as an X direction. In the first embodiment, the X direction, the Y direction, and the Z direction are orthogonal to each other.

Figure 1A:
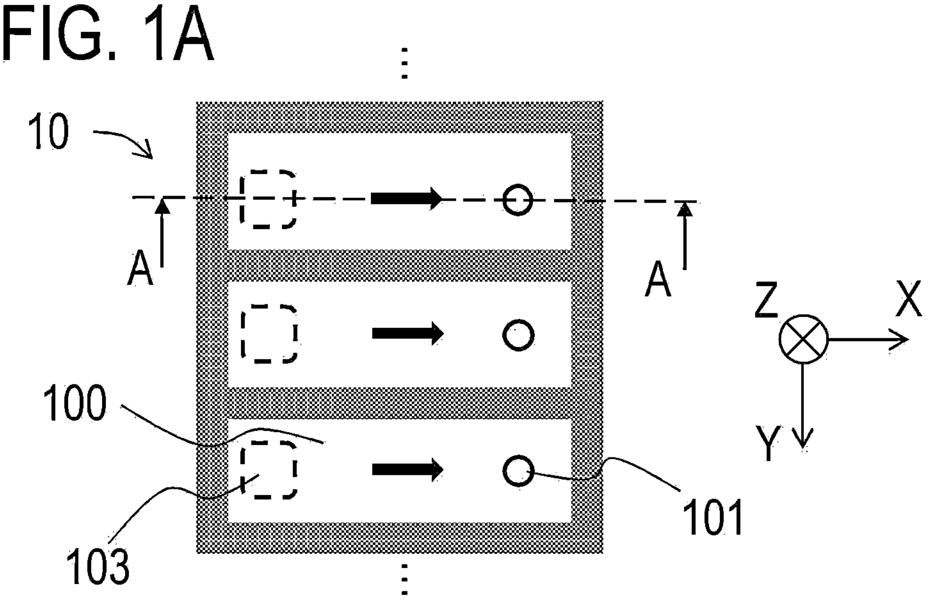
FIGS. 1A and 1B are schematic diagrams illustrating a configuration of an element substrate according to a first embodiment.
Figure 1B:
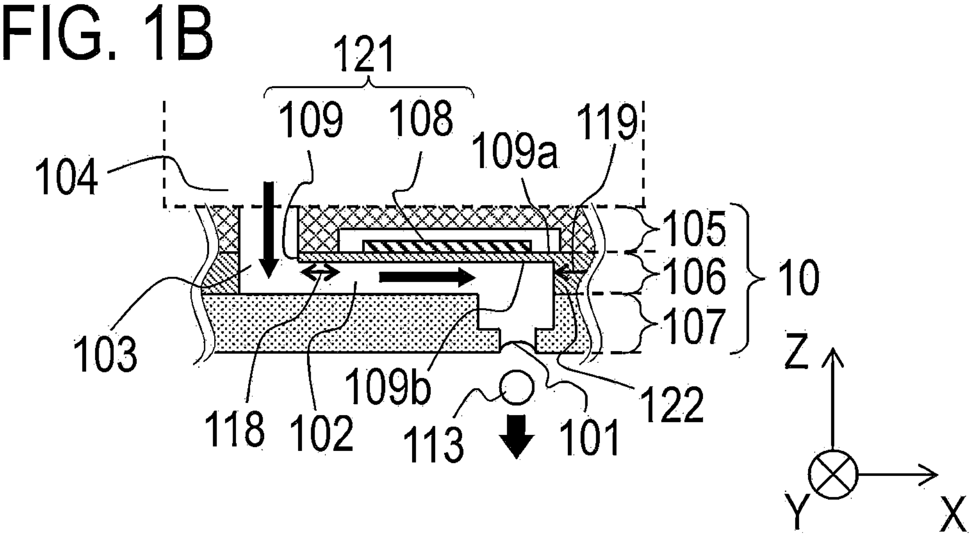

FIGS. 1A and 1B are schematic diagrams illustrating the configuration of the element substrate 10 according to the first embodiment. The element substrate 10 is an element substrate made up of a combination of three types of substrates (first channel substrate 105, second channel substrate 106, and third channel substrate 107). The element substrate 10 is provided in a liquid discharging head provided in a liquid discharging device such as a printer or the like, and discharges liquid (droplets) from the discharge orifices 101 by being driven by actuators 121 provided therein.

In one element substrate 10, a plurality of channel blocks 100 containing the discharge orifices 101 are formed. FIG. 1A is a transparent view of the plurality of channel blocks 100 as viewed from a side facing the discharge orifice face including the discharge orifices 101. FIG. 1B is a cross-sectional view taken along line A-A in FIG. 1A.

The channel blocks 100 include the discharge orifices 101, pressure chambers 102 that communicate with the discharge orifices 101, and supply channels 103 connected to the pressure chambers 102. A common liquid chamber 104 is connected to the supply channels 103 of the element substrate 10, and ink is supplied from the in common liquid chamber 104 to each of the pressure chambers 102 through each of the supply channels 103. FIGS. 1A and 1B indicate the direction of flow of ink by arrows.

As illustrated in FIG. 1B, a configuration is made in which the first channel substrate 105, the second channel substrate 106, and the third channel substrate 107 are stacked in the Z direction in the element substrate 10 according to the first embodiment. The first channel substrate 105 is a substrate in which channels for supplying ink from the common liquid chamber 104 to the pressure chambers 102 are formed. The second channel substrate 106 is a substrate having the actuators 121 including piezoelectric elements 108, and the pressure chambers 102. The third channel substrate 107 is a substrate including the discharge orifice face where the discharge orifices 101 are formed. In a case of a configuration in which the element substrate 10 is mounted to a liquid discharging head and discharges ink vertically downward, the element substrate 10 is made up of the first channel substrate 105, the second channel substrate 106, and the third channel substrate 107 arrayed in that order from above.

A piezoelectric element 108 is provided corresponding to each of the discharge orifices 101 in the element substrate 10. In other words, a supply channel 103, a pressure chamber 102, and a discharge orifice 101, are formed corresponding to each piezoelectric element 108. Each pressure chamber 102 is sectioned off from pressure chambers 102 that are adjacent in the Y direction by partition walls, and accordingly the corresponding piezoelectric element 108 is not directly affected by adjacent piezoelectric elements 108. Each piezoelectric element 108 is disposed on an installation face 109*a* of a diaphragm 109 provided in the element substrate 10. The piezoelectric element 108 and the diaphragm 109 makes up the actuator 121 that generates energy for discharging a liquid such as ink or the like from the discharge orifice 101.

The diaphragm 109 is configured so as to be capable of vibrating, and a peripheral edge portion thereof is fixed (constrained). For example, a first constraining region 118 that is one end portion of the diaphragm 109 in the X direction, and a second constraining region 119 that is the other end portion thereof in the X direction are fixed so as not to vibrate. A portion of an unconstrained region of the diaphragm 109 that is not constrained functions as the installation face (first face) 109*a* on which the piezoelectric element 108 is provided. In the first embodiment, the installation face 109*a* is substantially parallel to the X direction and the Y direction.

The first constraining region 118 is a region in which vibration is constrained so as to be suppressed by the third channel substrate 107, by the installation face 109*a* of the diaphragm 109 being joined to the third channel substrate 107. The second constraining region 119 is a region in which vibration is constrained so as to be suppressed by a base layer 122, by a rear face 109*b* (second face) of the installation face 109*a* of the diaphragm 109 being joined to the base layer 122 of the second channel substrate 106. By the diaphragm 109 being constrained as described above at the first constraining region 118 and the second constraining region 119, vibration of the diaphragm 109 is suppressed at the respective regions.

Ink stored in the pressure chamber 102 forms a meniscus at the discharge orifice 101 in a stable state. When a voltage waveform is applied to the piezoelectric element 108 in accordance with a discharge signal, the piezoelectric element 108 is deformed, and the pressure chamber 102 can be made to expand or contract. Combining expanding and contracting actions generates a droplet 113 from the meniscus, and an ink droplet is discharged toward an ambient air side (downward direction in FIG. 1B).

Note that the actuator 121 made up of the piezoelectric element 108 and the diaphragm 109 is viewed as being part of the second channel substrate 106 in the first embodiment, but the actuator 121 may be viewed as being a device provided between the second channel substrate 106 and the third channel substrate 107. Also, the diaphragm 109 may be viewed as being a component of the piezoelectric element 108.

Actuator

Figures 2A, 2B:
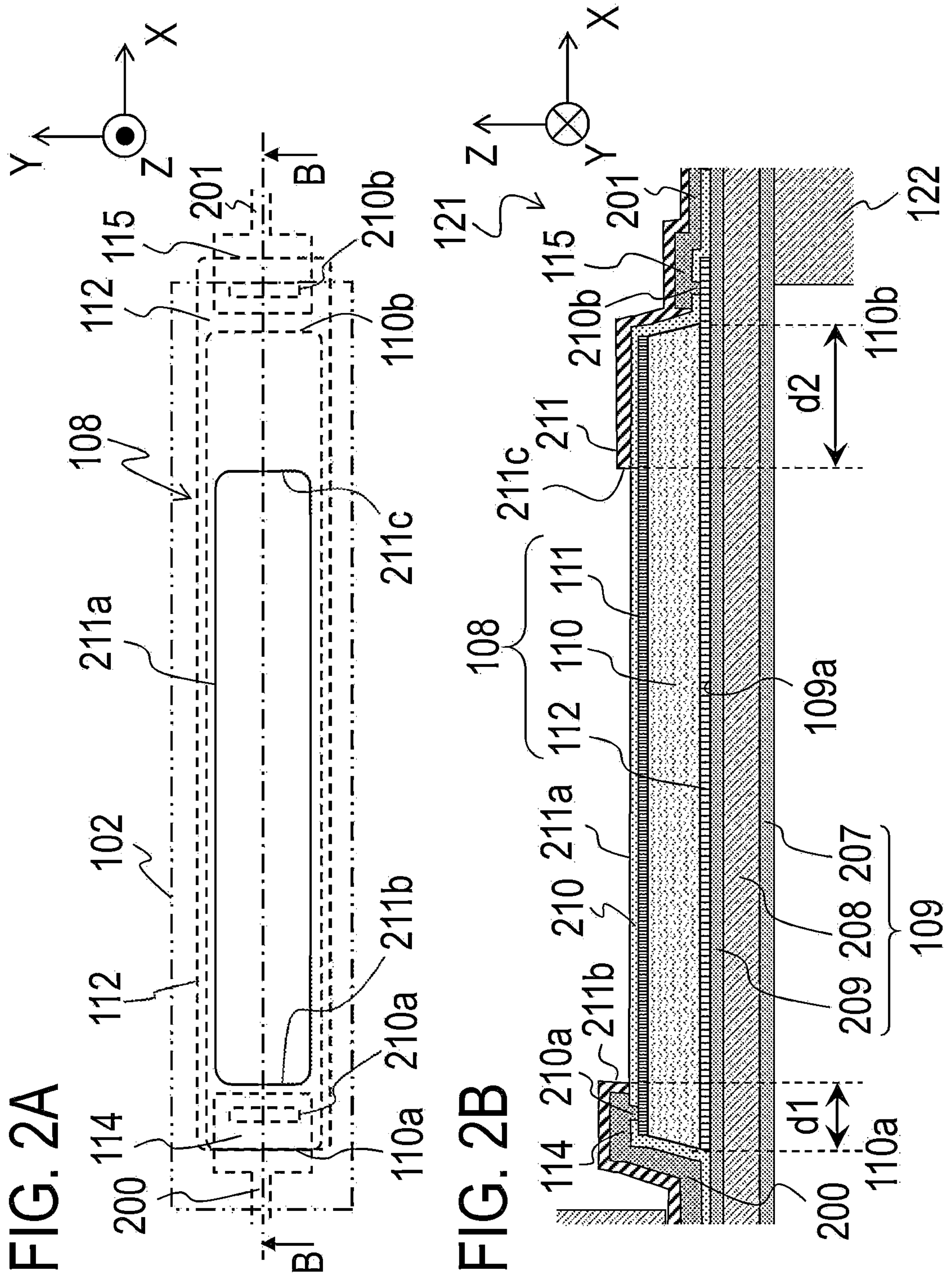
FIGS. 2A and 2B are schematic diagrams illustrating a configuration of an actuator according to the first embodiment.

Next, a detailed configuration of the actuator 121 will be described. FIGS. 2A and 2B are schematic diagrams illustrating the configuration of the actuator 121. FIG. 2A is a top view of the second channel substrate 106 with the piezoelectric element 108 formed on an upper face thereof, as viewed from the Z direction. FIG. 2B is a cross-sectional view taken along line B-B in FIG. 2A, illustrating the actuator 121 as viewed from the Y direction. Note that in FIG. 2A, a sealing film 211 covering the piezoelectric element 108, and part of films of the piezoelectric element 108, are omitted from illustration, in order to illustrate the layout configuration of the films and electrodes making up the piezoelectric element 108.

A perimeter of the diaphragm 109 making up an outer wall of the pressure chamber 102 is surrounded by a constraining region including the first constraining region 118 and the second constraining region 119. The piezoelectric element 108, which has a membrane structure that is capable of expanding and contracting the pressure chamber 102 so as to change the volume thereof, is provided on the opposite side of the diaphragm 109 from the pressure chamber 102. The piezoelectric element 108 is made up of a piezoelectric film 110, an upper electrode 111, and a lower electrode 112, formed on the diaphragm 109. In addition to the piezoelectric element 108 and the diaphragm 109, the actuator 121 includes an upper electrode pad 114 and a lower electrode pad 115, and the piezoelectric element 108 is covered by an insulating film 210 and the sealing film 211.

As illustrated in FIG. 2B, the piezoelectric element 108 is made up of the piezoelectric film 110, and the upper electrode 111 and the lower electrode 112 that are formed sandwiching the piezoelectric film 110 from above and below. Applying voltage to the upper electrode 111 and the lower electrode 112 of the piezoelectric element 108 drives the piezoelectric element 108, thereby discharging a droplet 113 from the discharge orifice 101. Voltage necessary to obtain a sufficient amount of displacement of the piezoelectric element 108 for discharge of droplets is in the order of several dozen volts. Various types of electrodes and wiring are covered by the insulating film 210 and the sealing film 211 that have insulating properties, in order to protect the electrodes of the piezoelectric element 108 and the wiring connected to the electrodes.

The piezoelectric element 108 having the membrane structure makes up the actuator 121 that is a unimorph-type piezoelectric actuator. The piezoelectric film 110 making up the piezoelectric element 108 is formed on the installation face 109*a* side of the diaphragm 109. The piezoelectric element 108 is formed on the opposite side of the diaphragm 109 from the pressure chamber 102, and is sealed off by the diaphragm 109, the third channel substrate 107, and so forth. The piezoelectric element 108 is disposed so as not to come in contact with the ink by such a layout configuration. In the first embodiment, a longitudinal direction of the piezoelectric element 108 and the diaphragm 109 is parallel to the X direction, and a transverse direction that intersects the longitudinal direction is parallel to the Y direction.

The lower electrode 112 is a first electrode layer that comes into contact with the installation face 109*a*, and the piezoelectric film 110 is stacked upon the lower electrode 112 as a piezoelectric layer. The X-directional length of the lower electrode 112 is longer than the X-directional length of the piezoelectric film 110. In the X direction (first direction), one end of the lower electrode 112 is at substantially the same position as a first end 110*a* that is one end of the piezoelectric film 110, and the other end of the lower electrode 112 is at a position beyond a second end 110*b* that is the other end of the piezoelectric film 110. In other words, the other end of the lower electrode 112 extends in the X direction in comparison to the second end 110*b* of the piezoelectric film 110.

The upper electrode 111 is a second electrode layer that is stacked on the piezoelectric film 110. The length of the upper electrode 111 in the X direction is substantially equivalent to the length of the piezoelectric film 110 in the X direction. That is to say, in the X direction, one end of the upper electrode 111 is at substantially the same position as the first end 110*a* of the piezoelectric film 110, and the other end of the upper electrode 111 is at substantially the same position as the second end 110*b* of the piezoelectric film 110. Thus, the piezoelectric element 108 is made up of the lower electrode 112, the piezoelectric film 110, and the upper electrode 111 being stacked in that order in the Z direction (second direction) that is perpendicular to the installation face 109*a*. The width of each of the lower electrode 112, the piezoelectric film 110, and the upper electrode 111 in the Y direction (third direction) is substantially the same.

The upper electrode pad 114 is disposed as a first electrode member on an end portion of the piezoelectric element 108 at the first end 110*a* side, and the lower electrode pad 115 is disposed as a second electrode member on an end portion at the second end 110*b* side. The upper electrode pad 114 is connected to the end portion of the upper electrode 111 at the first end 110*a* side. The lower electrode pad 115 is the end portion on the second end 110*b* side of the lower electrode 112, and is connected to an extension region that has been extended from the piezoelectric film 110 in the X direction. In the first embodiment, electrode members such as the upper electrode pad 114 and the lower electrode pad 115 are being described in a manner distinguished from the piezoelectric element 108, but these electrode members may be viewed as being components of the piezoelectric element 108.

Signal wiring 200 for supplying operation signals, and common wiring 201 for providing common potential, are connected to the piezoelectric element 108. The signal wiring 200 is connected to the upper electrode pad 114 and extends from the upper electrode pad 114 in the X direction. That is to say, the upper electrode pad 114 electrically communicates between the upper electrode 111 and the signal wiring 200. The common wiring 201 is electrically connected to the lower electrode pad 115 and extends from the lower electrode pad 115 in the X direction. The common wiring 201 provides common potential to a plurality of the piezoelectric elements 108. That is to say, the lower electrode pad 115 electrically communicates between the lower electrode 112 and the common wiring 201.

The diaphragm 109 can be selected from a silicon nitride film, silicon, metal, thermal glass, and so forth, as long as necessary mechanical properties, reliability, and so forth, are satisfied. In the first embodiment, a silicon on insulator (SOI) water is used for the diaphragm 109, as a configuration example of the diaphragm 109. The diaphragm 109 is formed from a silicon oxide film (buried oxide (BOX) layer) 207, a silicon film (device layer) 208, and a silicon oxide film 209. These films are stacked in the order of the silicon oxide film 207, the silicon film 208, and the silicon oxide film 209, from the farthest from the piezoelectric element 108.

Lead zirconate titanate that readily yields a great amount of displacement is primarily used for the piezoelectric film 110, but other piezoelectric materials can be used as well, such as barium titanate, lead titanate, lead metaniobate, bismuth titanate, zinc oxide, aluminum nitride, sodium potassium niobate, and so forth. Also, the piezoelectric film 110 may be made up of a plurality of layers of films.

A material with a high melt temperature is preferably used for the lower electrode 112, due to being subjected to high temperatures of several hundred degrees Celsius in some cases, in subsequent processes. Examples of such materials include copper, platinum, gold, chromium, cobalt, titanium, and alloys thereof. Also, in a case of forming the piezoelectric film 110 in contact with an upper surface of the lower electrode 112, the lower electrode 112 may be made as a film that controls crystal orientation of the piezoelectric film 110. In this case, a material that has a suitable crystalline structure is selected as appropriate for the material to be used. For example, in a case in which the material of the piezoelectric film 110 is lead zirconate titanate, platinum is preferably used as the crystal orientation control film.

It is sufficient for the upper electrode 111 to exhibit electroconductivity, and materials that are commonly used as electrode materials are useable as the material thereof, examples of which include aluminum, copper, tungsten, titanium, chromium, gold, platinum, and so forth. Note, however, in a case in which internal stress of the lower electrode 112 and so forth is great, causing the piezoelectric film 110 to flex, the upper electrode 111 may be imparted with inverse internal stress, thereby acting to cancel out the stress of the overall device. An alloy of titanium and tungsten is an example of such a material.

Materials that are commonly used for electrical wiring can be used as the material for the signal wiring 200 and the common wiring 201. Examples of materials that can be used include aluminum, copper, gold, alloys thereof, and so forth. Also, a titanium or chromium film may be interposed to improve adhesion to a foundation layer. Note that driving of the piezoelectric element 108 is generally performed by applying a high voltage of 30 V or more at a high frequency of several hundred to several thousand Hz. Accordingly, a high through rate is necessary for the wiring, which needs to be dealt with by making the wiring film relatively thick, and so forth.

The insulating film 210 is formed on the upper electrode 111, and on upper layers of the extension region of the lower electrode 112. An upper contact portion 210*a* and a lower contact portion 210*b* are opened in the insulating film 210. Note that the insulating film 210 may be viewed as being a component of the piezoelectric element 108.

The upper contact portion 210*a* opens in the vicinity of the first end 110*a* of the piezoelectric element 108, and the upper electrode pad 114 that communicates with the signal wiring 200 is formed at the upper layer thereof. The upper electrode pad 114 and the upper electrode 111 electrically communicate via the upper contact portion 210*a*.

The lower contact portion 210*b* opens at the vicinity of the second end 110*b* of the piezoelectric element 108, on the extension region of the lower electrode 112. The lower electrode pad 115 that communicates with the common wiring 201 is formed at the upper layer of the lower contact portion 210*b*. The lower electrode pad 115 and the lower electrode 112 electrically communicate via the lower contact portion 210*b*.

The sealing film 211 is formed at the upper layer of the upper electrode pad 114, the signal wiring 200, the lower electrode pad 115, and the common wiring 201. These electrical connecting members are electrically protected by being covered by the sealing film 211. Also, the sealing film 211 is formed at the upper layer of the insulating film 210 where the upper electrode pad 114 and the lower electrode pad 115 are not formed, as well. Note that the sealing film 211 may be viewed as being a component of the piezoelectric element 108.

A common insulating material, examples of which include silica, silicon nitride, oxynitride, alumina, and so forth, can be used for the insulating film 210. However, a high voltage of 30 V or higher is generally applied for driving the piezoelectric element 108 as described above, and accordingly a material and film thickness needs to be selected taking into consideration the breakdown field strength.

The upper electrode pad 114 may be integrally formed with the signal wiring 200 from the same material thereof. In the same way, the lower electrode pad 115 may be integrally formed with the common wiring 201 from the same material thereof. That is to say, a configuration may be made in which electrode members, in which electrode pads and wiring are integrally formed, are connected to the electrodes of the piezoelectric element 108. Now, the film thickness of the signal wiring 200 and the common wiring 201 is generally set to be thick, as described above. Also, further, in a case in which an aluminum alloy is used as the material for the wiring members, for example, the Young's modulus thereof is around 60 to 100 GPa, which is equivalent to a common piezoelectric film. That is to say, in a case of integrally forming wiring and electrode pads, in the configuration of the first embodiment, the proximity of the first end 110*a* of the piezoelectric element 108 will be covered with a metal film that is relatively thick and highly rigid. Consequently, displacement in the vicinity of the first end 110*a* of the piezoelectric element 108 is suppressed by the upper electrode pad 114.

Note that in the first embodiment, the signal wiring 200 is disposed at a position where it does not overlap the piezoelectric element 108 as viewed from the Z direction, but the signal wiring 200 may be disposed at a position where it overlaps the end portion of the piezoelectric element 108 on the first end 110*a* side. According to such a configuration, the signal wiring 200 functions as a part of the electrode members suppressing displacement at the vicinity of the first end 110*a* of the piezoelectric element 108. Further, in a case in which the signal wiring 200 is directly connected to the upper electrode 111 without going through the upper electrode pad 114, the signal wiring 200 functions as both an electrode member and a wiring member, thereby suppressing displacement at the vicinity of the first end 110*a* of the piezoelectric element 108.

The sealing film 211 is required to have a function of preventing malfunctioning caused by electric current flowing along the surface of the device under a high-humidity environment. Accordingly, the sealing film 211 has both high insulating properties and coverage, and covers the common wiring 201, the upper electrode pad 114, and the lower electrode pad 115 along with the signal wiring 200. Silica, silicon nitride, alumina, and so forth, which have high insulating properties, are suitably used as the material for the sealing film 211.

Generally, a material that has high rigidity is suitably used for the sealing film 211. For example, the Young's modulus of silicon nitride and alumina is around 120 to 300 GPa and 170 to 360 GPa respectively, which is extremely high even in comparison with the 60 to 100 GPa of lead zirconate titanate. Accordingly, covering the entire face of the piezoelectric element 108 by the sealing film 211 will reduce the amount of displacement of the piezoelectric element 108 greatly, and there is concern that normal ink discharging operations may not be performed. Accordingly, in the first embodiment, the sealing film 211 is removed from regions of the piezoelectric element 108 where there is no need to cover with the sealing film 211. In other words, a recessed portion 211*a*, serving as a film-removed region in which at least part of the film is removed, is formed in the sealing film 211 over the piezoelectric element 108, in order to prevent displacement of the piezoelectric element 108 from being excessively suppressed.

The recessed portion 211*a* is formed at a position between the first end 110*a* and the second end 110*b* in the X direction, which overlaps the piezoelectric film 110, the upper electrode 111, and the lower electrode 112 as viewed from the Z direction. The Y-directional width of the recessed portion 211*a* is smaller than the Y-directional width of the piezoelectric element 108. The recessed portion 211*a* according to the first embodiment is substantially rectangular as viewed in the Z direction, and the outline thereof is indicated in FIG. 2A by a dotted line. Note that the recessed portion 211*a* may be a region in which the film is completely removed opening, or may be a region in which the film is partly remoted, and a film that is thinner relative to other regions remains.

FIG. 2B illustrates the X-directional distance from the first end 110*a* of the piezoelectric film 110 to an end 211*b* of the recessed portion 211*a* on the first end 110*a* side as being a distance d1. Also, FIG. 2B illustrates the X-directional distance from the second end 110*b* of the piezoelectric film 110 to an end 211*c* of the recessed portion 211*a* on the second end 110*b* side as being a distance d2. In the first embodiment, the recessed portion 211*a* of the sealing film 211 is formed such that the distance d2 is greater than the distance d1 in the longitudinal direction (X direction, first direction) of the piezoelectric element 108. In order to describe the reason why the sealing film 211 has been configured in this way, the displacement suppressing effects of the sealing film 211 will first be described.

Comparative Example

Figure 3A:
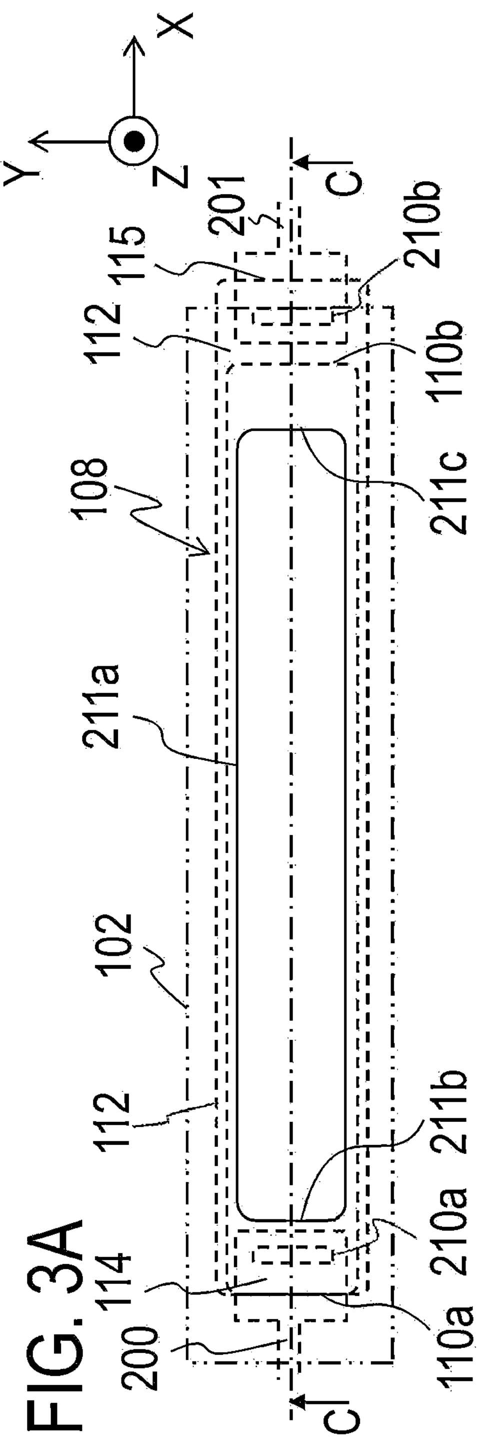
FIGS. 3A and 3B are schematic diagrams illustrating a configuration of an actuator according to a comparative example.
Figure 3B:
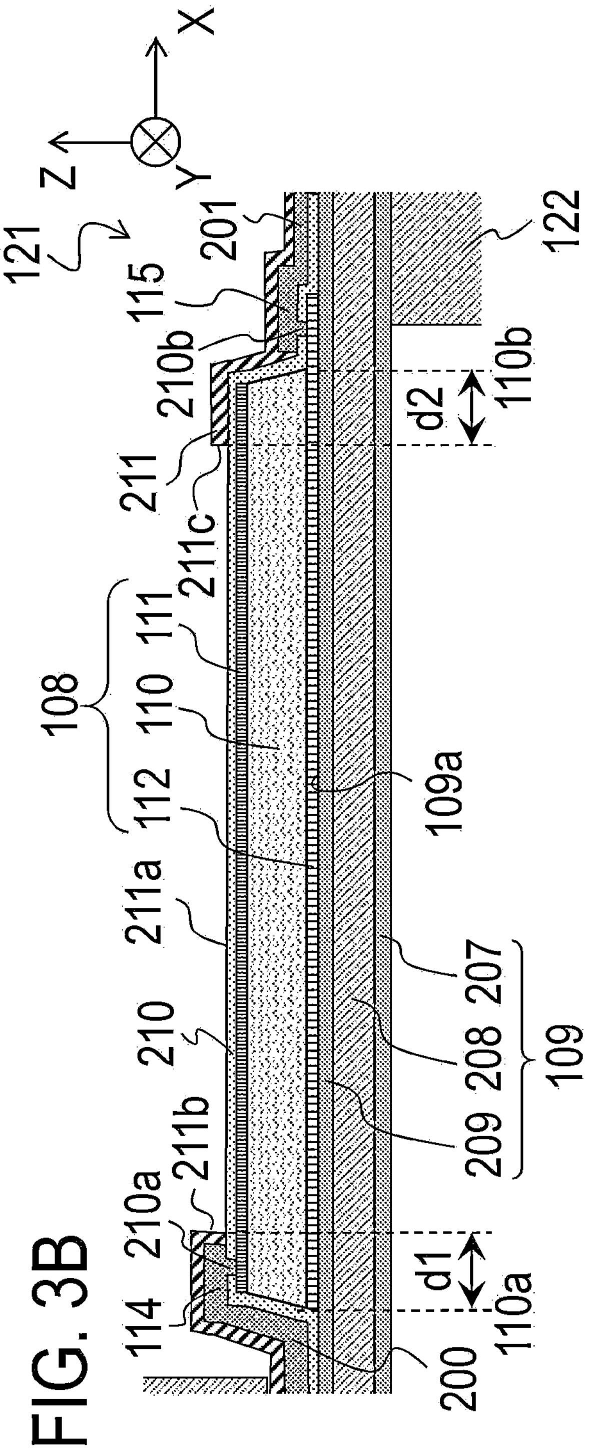

Ahead of the description of the displacement suppressing effects by the configuration according to the first embodiment, description will be made regarding a comparative example in which the sealing film 211 configured such that the distance d1 and the distance d2 are equal is formed. The configuration of the comparative example differs from the first embodiment with respect to the end portion position of the second end 110*b* side of the recessed portion 211*a* of the sealing film 211. FIGS. 3A and 3B are schematic diagrams illustrating a configuration of the actuator 121 according to the comparative example. FIG. 3A is a top view of the second channel substrate 106 with the piezoelectric element 108 formed on an upper face thereof, as viewed from the Z direction. FIG. 3B is a cross-sectional view taken along line C-C in FIG. 3A, illustrating the actuator 121 as viewed from the Y direction. Note that in FIG. 3A, the sealing film 211 covering the piezoelectric element 108, and part of films of the piezoelectric element 108, are omitted from illustration, in order to illustrate a layout configuration of the films and electrodes making up the piezoelectric element 108.

As described above, the distance d2 is equivalent to the distance d1 in the comparative example, and is smaller than the distance d2 in the first embodiment. Accordingly, in the comparative example, the displacement suppressing effects of the piezoelectric element 108 by the sealing film 211 are around the same at both end portions in the X direction.

The upper electrode pad 114 is disposed overlaid on the end portion of the piezoelectric film 110 at the first end 110*a* side. Conversely, the lower electrode pad 115 is connected to the extension region of the lower electrode 112 not overlapping the piezoelectric film 110, and none of the electrode members (electrode films) overlap the end portion of the piezoelectric film 110 on the second end 110*b* side. As described above, the electrode material of the upper electrode pad 114 and so forth can suppress displacement of the piezoelectric element 108 in the same way as the sealing film 211. Accordingly, in the comparative example, the displacement suppressing effects of the piezoelectric element 108 by the electrode members is greater at the end portion on the first end 110*a* side than that at the end portion on the second end 110*b* side.

Figure 4:
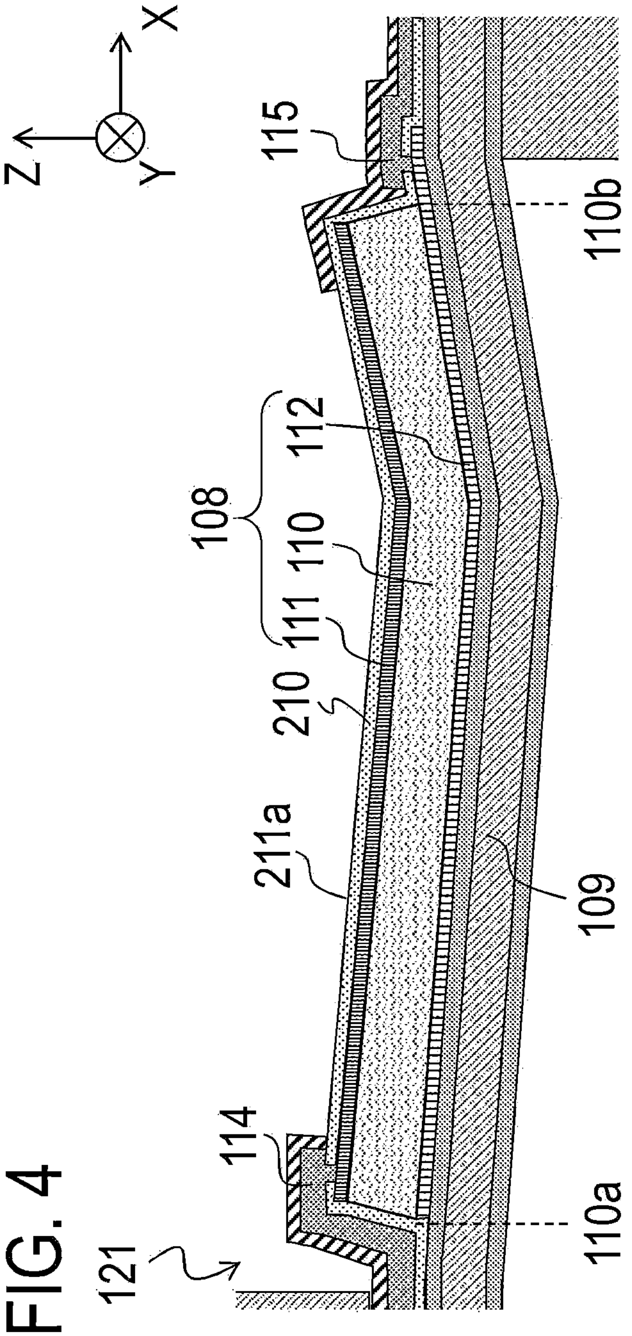
FIG. 4 is an explanatory diagram of operations of the actuator according to the comparative example.

FIG. 4 is a diagram illustrating the actuator 121 according to the comparative example operating, and the piezoelectric element 108 and the diaphragm 109 being displaced. As described above, the vicinity of the first end 110*a* of the piezoelectric element 108 is suppressed from displacement by the upper electrode pad 114. Conversely, there is no electrode member such as an electrode pad or the like present at the upper layer of the second end 110*b* of the piezoelectric element 108, and displacement is not suppressed. As a result, the amount of displacement of the piezoelectric element 108 at the second end 110*b* side is greater than the amount of displacement at the first end 110*a* side, which can lead to a position of greatest displacement of the piezoelectric element 108 to shift to the second end 110*b* side, and the amount of displacement at the second end 110*b* side becoming excessive, as illustrated in FIG. 4. When the amount of displacement at the second end 110*b* side becomes excessive, and the piezoelectric element 108 deforms more rapidly at the second end 110*b* side, stress can become concentrated at a boundary portion of the piezoelectric film 110 and the lower electrode 112 at the second end 110*b* of the piezoelectric element 108, causing damage of the piezoelectric film 110 or the lower electrode 112, or boundary separation thereof.

Accordingly, in the first embodiment, the recessed portion 211*a* is configured such that the deformation at the second end 110*b* side of the piezoelectric element 108 can be suppressed greatly by the sealing film 211, in order to reduce the difference in the amount of displacement (degree of displacement) at the first end 110*a* side and the amount of displacement (degree of displacement) at the second end 110*b* side. More specifically, the distance d2 was made to be greater than the distance d1. According to such a configuration, the end portion on the second end 110*b* side of the piezoelectric film 110 is covered by more of the thick portion of the sealing film 211 (the portion excluding the recessed portion 211*a*) as compared to the end portion on the first end 110*a* side.

Figure 5:
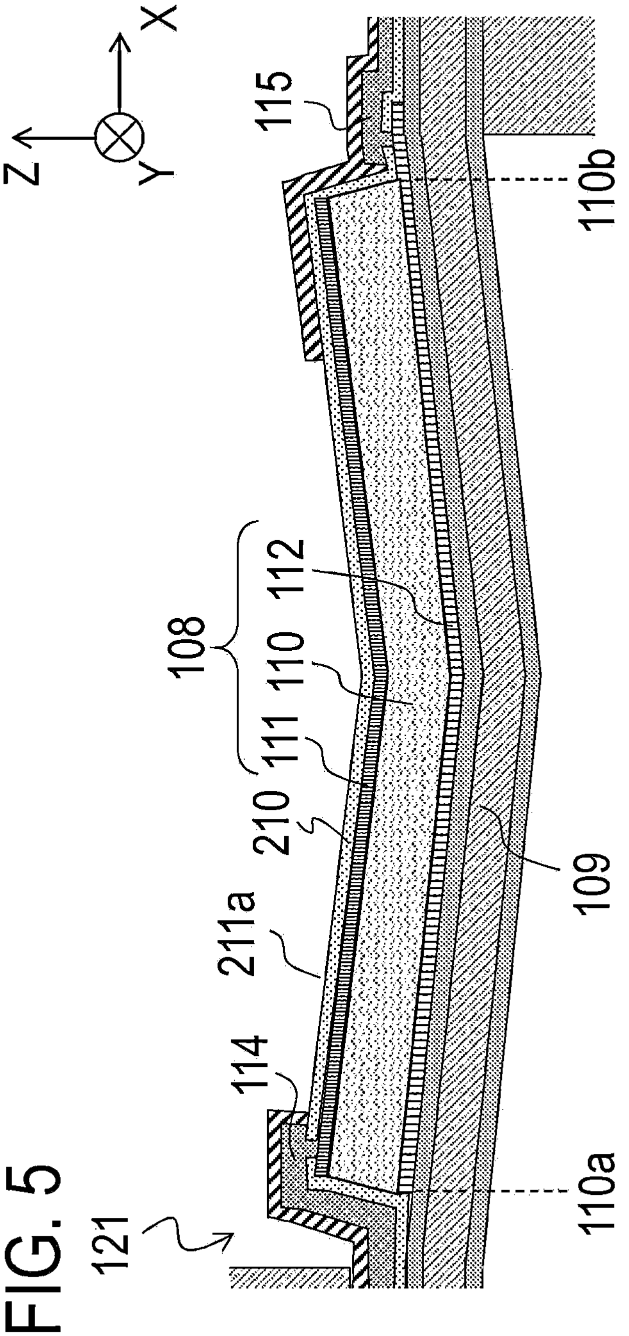
FIG. 5 is an explanatory diagram of operations of the actuator according to the first embodiment.

FIG. 5 is a diagram illustrating the actuator 121 according to the first embodiment operating, and the piezoelectric element 108 and the diaphragm 109 being displaced. The displacement suppressing effects of the first embodiment at the second end 110*b* side by the sealing film 211 are higher in comparison with the comparative example. As illustrated in FIG. 5, the difference between the amount of displacement at the first end 110*a* side and the amount of displacement at the second end 110*b* side is reduced, with the position of greatest displacement of the piezoelectric element 108 being at a substantially intermediate position in the X direction between the first end 110*a* and the second end

110*b*. As a result, concentration of stress on the second end 110*b* of the piezoelectric element 108 is reduced, and damage of the piezoelectric element 108 is suppressed.

Thus, in the configuration according to the first embodiment, in order to suppress deviation in the X direction of deformation of the piezoelectric element 108 when the actuator 121 is operating, the recessed portion 211*a* is formed in the sealing film 211 so as to realize a relation of distance d2>distance d1. According to this configuration, damage of the piezoelectric film 110 and the lower electrode 112, and boundary separation between the piezoelectric film 110 and the lower electrode 112, is suppressed from occurring, and damage of the piezoelectric element 108 is suppressed.

Manufacturing Method of Element Substrate

Next, an example of a manufacturing method of the element substrate 10 according to the first embodiment will be described. First, a manufacturing method of the second channel substrate 106 including the actuator 121 will be described with reference to FIGS. 6A to 6I, and a method of manufacturing the element substrate 10 using this second channel substrate 106 will be described with reference to FIGS. 7A to 7C. FIGS. 6A to 6I are diagrams illustrating a manufacturing method of the actuator 121 of the second channel substrate 106. FIGS. 7A to 7C are diagrams illustrating the manufacturing method of the element substrate 10.

Figure 6A:
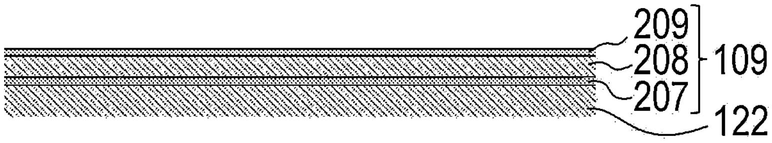
FIGS. 6A to 6I are schematic diagrams illustrating a manufacturing method of a second channel substrate according to the first embodiment.
Figure 7A:
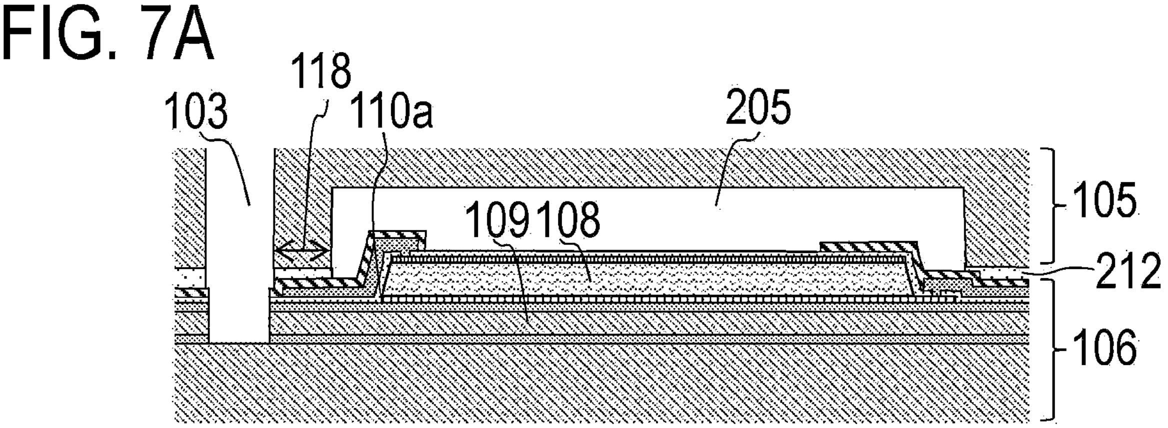
FIGS. 7A to 7C are schematic diagrams illustrating a manufacturing method of an element substrate according to the first embodiment.
Figure 7B:
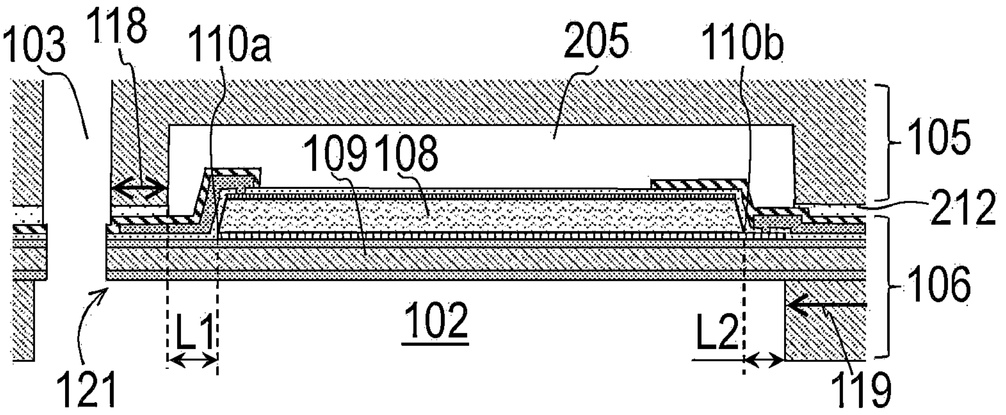
Figure 7C:
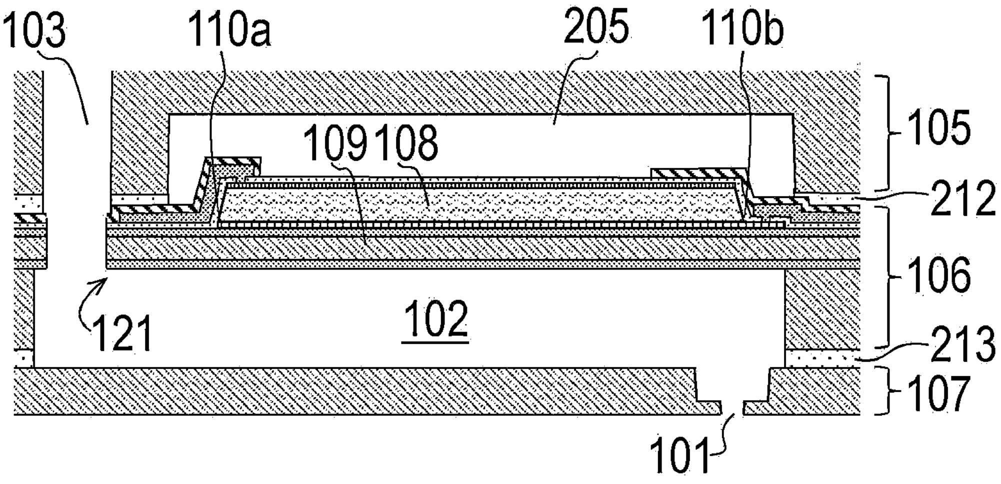

FIG. 6A illustrates the silicon oxide film 207, the silicon film 208, and the silicon oxide film 209, making up the diaphragm 109, formed on the base layer 122 of the second channel substrate 106. The base layer 122 is a SOI wafer. A silicon thermal oxide film around 500 nm is formed by wet oxidization using oxygen and hydrogen gas, thereby forming the silicon oxide film 209 that is an insulating film.

Figure 6B:
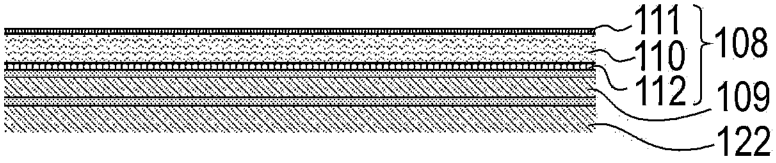

FIG. 6B illustrates the lower electrode 112, the piezoelectric film 110, and the upper electrode 111 formed on the diaphragm 109. The lower electrode 112, the piezoelectric film 110, and the upper electrode 111 are formed in that order, so as to be stacked on the diaphragm 109.

First, a platinum film 90 to 110 nm thick was formed by sputtering, as the lower electrode 112. Note that a film of titanium was formed to a thickness of 5 to 15 nm as an adhesion layer that is omitted from illustration, in order to obtain powerful adhesion between the lower electrode 112 and the silicon oxide film 209. Next, as the piezoelectric film 110, a film that is 1.9 to 2.1 μm thick was formed on the lower electrode 112 using the sol-gel method, so as to exhibit (100) orientation. Note that the Young's modulus of the piezoelectric film 110 was 70 to 100 GPa. The upper electrode 111 was then formed by sputtering. An alloy of titanium and tungsten was used as the material of the upper electrode 111, and the film thickness was 90 to 110 nm.

Figure 6C:
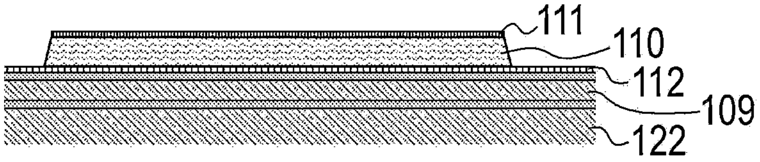

FIG. 6C illustrates the piezoelectric film 110 and the upper electrode 111 etched. A resist pattern (omitted from illustration) is formed by photolithography on the upper electrode 111 and the piezoelectric film 110 so as to obtain a desired pattern, following which etching is performed.

Figure 6D:
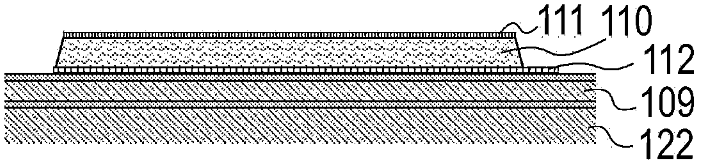

FIG. 6D illustrates the lower electrode 112 etched. A resist pattern is formed again by photolithography on the lower electrode 112 so as to obtain a desired pattern, following which etching is performed. At this time, in the longitudinal direction of the piezoelectric element 108, one end of the lower electrode 112 is at substantially the same position as one end of the piezoelectric film 110, and the other end of the lower electrode 112 protrudes beyond the other end of the piezoelectric film 110. That is to say, the lower electrode 112 is etched such that the length in the longitudinal direction is longer than the piezoelectric film 110. Through such procedures, the piezoelectric element 108 made up of the lower electrode 112, the piezoelectric film 110, and the upper electrode 111, is formed.

Figure 6E:
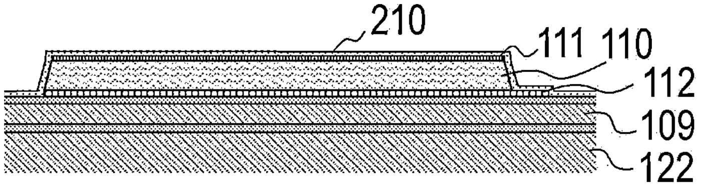

FIG. 6E illustrates the insulating film 210 formed. The insulating film 210 according to the first embodiment is a silicon oxide film that is 350 to 450 nm thick, and was formed by chemical vapor deposition (CVD). The insulating film 210 is formed to cover the entire face of the piezoelectric element 108.

Figure 6F:
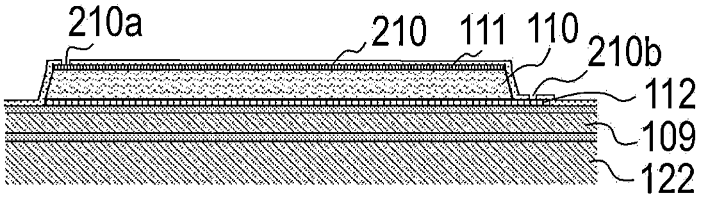

FIG. 6F illustrates the upper contact portion 210*a* and the lower contact portion 210*b* formed in the insulating film 210. The upper contact portion 210*a* is an opening (through hole) for connecting the upper electrode pad 114 to the upper electrode 111, and is formed by forming a resist pattern (omitted from illustration) by photolithography, following which etching of the insulating film 210 is performed. In the same way, the lower contact portion 210*b* is an opening (through hole) for connecting the lower electrode pad 115 to the lower electrode 112, and is formed by etching.

The upper contact portion 210*a*, which is a first opening, is formed at a position overlapping the piezoelectric film 110 as viewed from a stacking direction of the piezoelectric element 108. Conversely, the lower contact portion 210*b*, which is a second opening, is formed at a position that does not overlap the piezoelectric film 110 as viewed from the stacking direction of the piezoelectric element 108, but rather overlaps the portion of the lower electrode 112 that protrudes beyond the piezoelectric film 110.

Figure 6G:
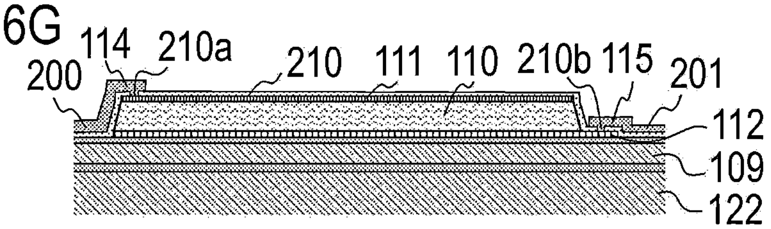

FIG. 6G illustrates wiring made up of the signal wiring 200, the common wiring 201, the upper electrode pad 114, the lower electrode pad 115, and so forth, formed. For the formation of these wiring members (electrode members), first, a film was formed on the insulating film 210 by sputtering. In the first embodiment, an alloy material of aluminum and copper was used as the material of each of the wiring members, and the thickness of each was 500 to 700 nm. Note that the Young's modulus of each of the wiring members was 60 to 80 GPa. After film formation, a resist pattern (omitted from illustration) was formed by photolithography so as to obtain a desired pattern, following which etching was performed to form the signal wiring 200, the common wiring 201, the upper electrode pad 114, and the lower electrode pad 115.

Through the above-described processes, in the present manufacturing example, the signal wiring 200 and the upper electrode pad 114 are integrally formed of the same material, and the upper electrode pad 114 connects to the upper electrode 111 via the upper contact portion 210*a*. In the same way, the common wiring 201 and the lower electrode pad 115 are integrally formed of the same material, and the lower electrode pad 115 connects to the lower electrode 112 via the lower contact portion 210*b*. The electrode members and the wiring members are formed such that the thickness of the signal wiring 200 and the upper electrode pad 114 in the Z direction is the same, and the thickness of the common wiring 201 and the lower electrode pad 115 in the Z direction is the same.

Figure 6H:
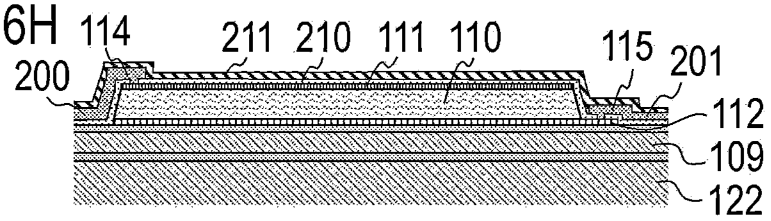

FIG. 6H illustrates the sealing film 211 formed. The sealing film 211 is formed so as to cover the piezoelectric element 108, the signal wiring 200, the common wiring 201, the upper electrode pad 114, and the lower electrode pad 115. For the sealing film 211, a silicon nitride film with high humidity prevention properties was formed by CVD to a film thickness of 150 to 250 nm. Note that the Young's modulus of the sealing film 211 is 120 to 150 GPa, which is greater than the Young's modulus of the various types of wiring members and the piezoelectric film 110.

Figure 6I:
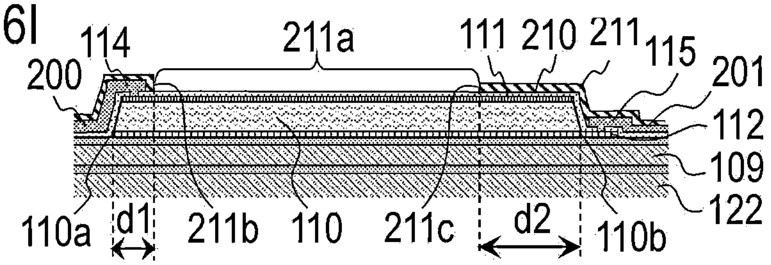

FIG. 6I illustrates the recessed portion 211*a* formed in the sealing film 211. The recessed portion 211*a* is formed by a resist pattern (omitted from illustration) being formed by photolithography following which etching of the sealing film 211 is performed. In the first embodiment, the recessed portion 211*a* is formed in a rectangular shape at a position overlapping the piezoelectric film 110, as viewed from the stacking direction of the piezoelectric element 108.

The recessed portion 211*a* is formed such that the distance d2 from the second end 110*b* of the piezoelectric film 110 to the end 211*c* of the second end 110*b* side of the recessed portion 211*a* is greater than the distance d1 from the first end 110*a* of the piezoelectric film 110 to the end 211*b* at the first end 110*a* side of the recessed portion 211*a*. More specifically, the recessed portion 211*a* is formed such that the distance d2 is at least 1.5 times and not more than 2.0 times the distance d1. Note that while the sealing film 211 is completely removed in the recessed portion 211*a* according to the first embodiment, whether or not to leave film in the recessed portion 211*a*, and the thickness and so forth of the recessed portion 211*a* when leaving film, can be decided as appropriate taking into consideration the amount of displacement of the piezoelectric element 108 and so forth. Also, although not illustrated, the sealing film 211 above a voltage application electrode terminal portion for driving the actuator that is present at the wiring ends of the signal wiring 200 and the common wiring 201 is also opened by the etching for forming the recessed portion 211*a*.

FIG. 7A illustrates the first channel substrate 105 and the second channel substrate 106 joined. After the recessed portion 211*a* is formed in the sealing film 211, the second channel substrate 106 is joined to the first channel substrate 105 via an adhesive layer 212. Note that in the first embodiment, the joining portion in the vicinity of the first end 110*a* of the piezoelectric element 108 is the first constraining region 118, and functions as a constraining region.

The first channel substrate 105 is fabricated by processing a silicon (Si) substrate. Prior to joining, a cavity portion 205 at a position that faces the piezoelectric element 108, and the supply channel 103 that communicates with the pressure chamber 102 later, are formed in the first channel substrate 105. When the first channel substrate 105 and the second channel substrate 106 are joined, the piezoelectric element 108 is then contained inside the cavity portion 205, and is situated between the first channel substrate 105 and the diaphragm 109.

FIG. 7B illustrates the pressure chamber 102 formed in the second channel substrate 106. In the present manufacturing example, grinding of the second channel substrate 106 is performed from a rear face side from a face on which the piezoelectric element 108 is formed, down to around a thickness of 60 to 80 μm, thereby forming the pressure chamber 102. The pressure chamber 102 is a space on the opposite side from the piezoelectric element 108 (cavity portion 205) across the diaphragm 109, and communicates with the supply channel 103. Due to the pressure chamber 102 being formed, the diaphragm 109 is configured so as to be capable of vibrating, and the actuator 121 is completed. Note that in the first embodiment, an unprocessed portion in the vicinity of the second end 110*b* of the piezoelectric element 108 is the second constraining region 119, and functions as a constraining region.

In the first embodiment, a distance L1 from an edge of the first constraining region 118 to the first end 110*a* of the piezoelectric element 108, and a distance L2 from an edge of the second constraining region 119 to the second end 110*b* of the piezoelectric element 108, are set so as to be substantially equivalent, in the longitudinal direction of the piezoelectric element 108. In other words, the piezoelectric element 108 is provided at a middle portion in the longitudinal direction of the non-constrained region of the diaphragm 109.

FIG. 7C illustrates the second channel substrate 106 and the third channel substrate 107 joined. The second channel substrate 106 in which the pressure chamber 102 is formed is joined to the third channel substrate 107 via an adhesive layer 213. The third channel substrate 107 is fabricated by processing an Si substrate, and the discharge orifice 101 is formed on a face thereof that is on the opposite side from a joining face as to the second channel substrate 106. The discharge orifice 101 is formed at a position that overlaps the piezoelectric element 108 as viewed from a discharging direction of ink, when the second channel substrate 106 and the third channel substrate 107 are joined.

The element substrate 10 fabricated by the processes described above is mounted and assembled to electrical components, supporting members, and so forth, thereby completing a liquid discharging head unit. A high-temperature high-voltage bias test was performed to evaluate the durability of this liquid discharging head unit. Specifically, under an environment of temperature of 85° C. and humidity of 85%, direct current (DC) voltage of 60 V was applied to drive the actuator 121, which was maintained for 200 hours. Thereafter, the state of the piezoelectric element 108 was confirmed, in which no destruction or separation of the piezoelectric element 108 was found, and it was confirmed that a normal state had been maintained.

Thus, according to the configuration of the first embodiment, damage to the piezoelectric element 108 at the end portion on which side the upper electrode pad 114 is not disposed is suppressed by the sealing film 211 for preventing insulation breakdown. Specifically, a region where the sealing film 211 is formed on the piezoelectric element 108 is provided more broadly at the end portion region of the piezoelectric element 108 where the upper electrode pad 114 is not provided, as compared to the end portion region of the piezoelectric element 108 where the upper electrode pad 114 is provided, thereby suppressing damage to the piezoelectric element 108.

Second Embodiment

Next, a second embodiment according to the present disclosure will be described. The second embodiment differs from the first embodiment with respect to the shape of the recessed portion 211*a* that is formed in the sealing film 211. In the configuration of the second embodiment below, only points that differ from the configuration of the first embodiment will be described. Configurations in the second embodiment that are the same as configurations in the first embodiment are denoted by the same signs, and description will be omitted.

Figure 8A:
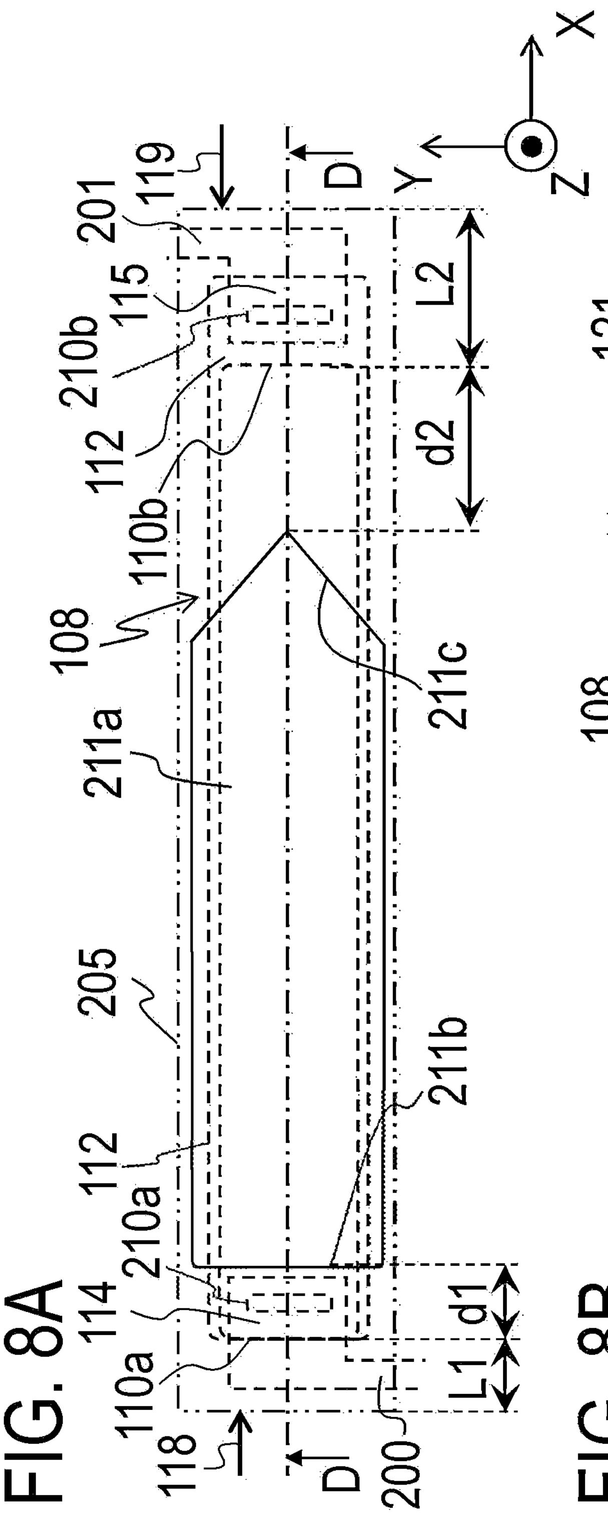
FIGS. 8A and 8B are schematic diagrams illustrating a configuration of an actuator according to a second embodiment.
Figure 8B:
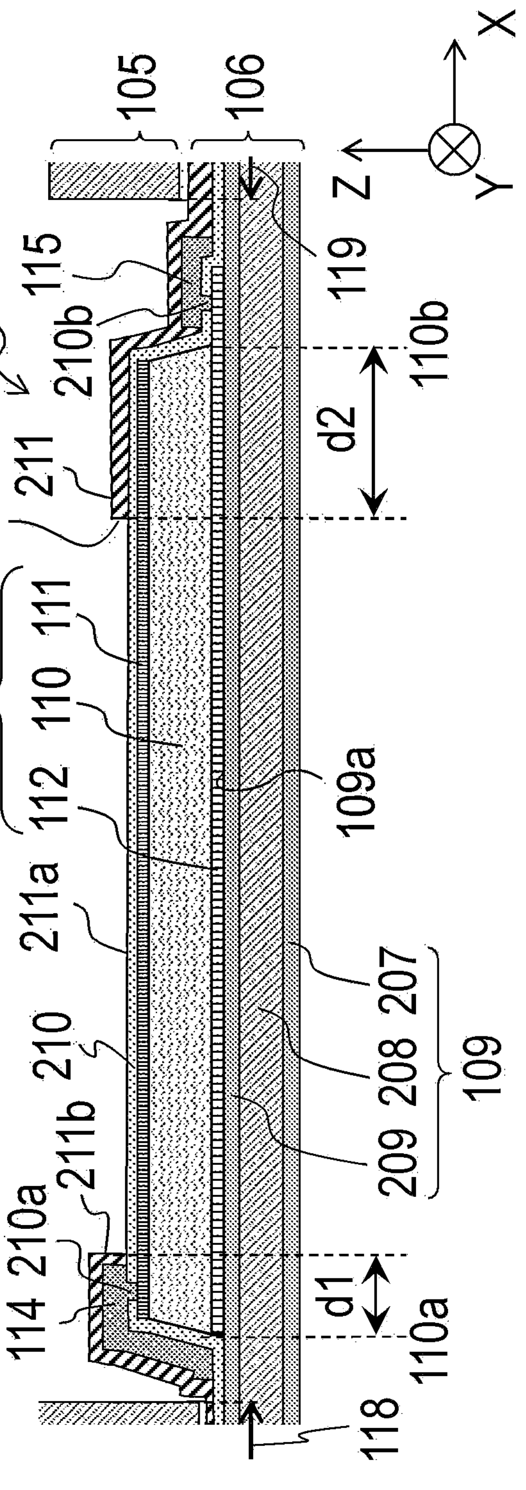

FIGS. 8A and 8B are schematic diagrams illustrating a configuration of the actuator 121 according to the second embodiment. FIG. 8A is a top view of the second channel substrate 106 with the piezoelectric element 108 formed on an upper face thereof, as viewed from the Z direction. FIG. 8B is a cross-sectional view taken along line D-D in FIG. 8A, illustrating the actuator 121 as viewed from the Y direction. Note that in FIG. 8A, the sealing film 211 covering the piezoelectric element 108, and part of films of the piezoelectric element 108, are omitted from illustration, in order to illustrate a layout configuration of the films and electrodes making up the piezoelectric element 108.

The recessed portion 211*a* according to the second embodiment has a Y-direction middle portion of the end 211*c* on the second end 110*b* side formed on a protruding shape that is convex toward the second end 110*b*, as viewed from the Z direction. That is to say, a Y-direction width of the end portion on the second end 110*b* side of the recessed portion 211*a* becomes gradually smaller toward the second end 110*b*. Due to such a configuration, the amount of displacement of the piezoelectric element 108 can be made to be uniform between the first end 110*a* side and the second end 110*b* side, while also improving damage suppression effects of the piezoelectric element 108.

Both end portions of the diaphragm 109 in the Y direction are constrained as well, and accordingly when the actuator 121 is driven, the middle portion of the piezoelectric element 108 in the Y direction is displaced most greatly. Accordingly, in order to adjust the amount of displacement of the piezoelectric element 108 to be uniform between the first end 110*a* side and the second end 110*b* side, the amount of the sealing film 211 at the position corresponding to the middle portion of the piezoelectric element 108 in the Y direction is particularly important. Accordingly, in the second embodiment, an X-direction length of the recessed portion 211*a* is made to be greater at the middle portion in the Y direction, thereby preventing the displacement of the piezoelectric element 108 from being excessively suppressed, and securing the amount of displacement of the piezoelectric element 108.

Meanwhile, the presence or absence of the sealing film 211, and the magnitude of film thickness thereof, in regions corresponding to the Y-direction end portions of the piezoelectric element 108, do not greatly affect the amount of displacement of the piezoelectric element 108 as compared to the region corresponding to the Y-direction middle portion. Also, separation of the piezoelectric film 110 from the lower electrode 112 in the vicinity of the second end 110*b* can occur regardless of whether the middle portion or end portions of the piezoelectric element 108 in the Y direction. Accordingly, in the second embodiment, reducing the area of the recessed portion 211*a* at the second end 110*b* side as compared to the first embodiment improves the strength of the piezoelectric element 108 at the Y-direction end portions, and improves the damage suppression effects of the piezoelectric element 108. Specifically, the shape that is convex toward the second end 110*b* side at the end portion on the second end 110*b* side of the recessed portion 211*a* increases the area in which the sealing film 211 having a great thickness is present at both end portions in the Y direction.

Also, in the second embodiment, Y-directional width of the recessed portion 211*a* is greater than the Y-directional width of the piezoelectric element 108. As compared with the end portion of the piezoelectric element 108 on the second end 110*b* side, the concern of destruction or separation of the piezoelectric film 110 or the lower electrode 112 is low at the other regions. Accordingly, in the second embodiment, the sealing film 211 is maximally eliminated from positions corresponding to regions in which the concern of damage of the piezoelectric element 108 is low, thereby suppressing reduction in the amount of displacement of the piezoelectric element 108 by the sealing film 211, and securing the amount of displacement of the piezoelectric element 108 necessary for discharging droplets.

In the second embodiment, the distance d2 from the second end 110*b* of the piezoelectric element 108 to the end 211*c* of the recessed portion 211*a* is set to be at least 2.0 times and not more than 2.5 times the distance d1 from the first end 110*a* of the piezoelectric element 108 to the end 211*b* of the recessed portion 211*a* in the X direction. In this way, the magnitude of the distance d2 as to the distance d1 can change as appropriate depending on the form of the recessed portion 211*a* and other elements, and setting the distance d2 within a range of at least 1.5 times and not more than 2.5 times the distance d1 is particularly suitable. Note that the distances d1 and d2 are defined as the shortest distance from the end of the piezoelectric film 110 to the end of the recessed portion 211*a*. Specifically, the distance d2 from the second end 110*b* of the piezoelectric element 108 to the end 211*c* of the recessed portion 211*a* is a distance from the second end 110*b* of the piezoelectric element 108 to a distal end of the convex portion of the recessed portion 211*a*.

In the second embodiment, the joining portions of the second channel substrate 106 and the first channel substrate 105 make up the first constraining region 118 and the second constraining region 119. Note that in the second embodiment, no wiring members or electrode members such as wiring, electrode pads, and so forth, are disposed at these joining portions. The reason is that the film thickness of the wiring members is 500 to 700 nm, and disposing the unevenness thereof in the joining portions worsens joining reliability in some cases. That is to say, worsening of joining reliability can be suppressed by disposing the signal wiring 200 and the common wiring 201 in positions that do not overlap the first constraining region 118 and the second constraining region 119 as viewed in the Z direction. In the second embodiment, the signal wiring 200 connected to the upper electrode pad 114 extends in the Y direction from the upper electrode pad 114, and the common wiring 201 connected to the lower electrode pad 115 extends in the Y direction from the lower electrode pad 115.

However, in a case of a configuration in which the wiring members are not disposed in the joining portions, the amount of displacement in the vicinity of the second end 110*b* of the piezoelectric element 108 can become even greater as compared to the amount of displacement in the vicinity of the first end 110*a*. The reason is that the second constraining region 119 needs to be disposed at least farther away from the piezoelectric element 108 than the lower electrode pad 115. Accordingly, the distance L2 from the end of the second constraining region 119 on the side closer to the second end 110*b*, to the second end 110*b* of the piezoelectric element 108 in the X direction, becomes longer than the distance L1 from the end of the first constraining region 118 on the side closer to the first end 110*a*, to the first end 110*a* of the piezoelectric element 108. FIG. 8A indicates each of the distance L1 and the distance L2.

The regions of the piezoelectric element 108 indicated by the distance L1 and the distance L2 are regions in which the piezoelectric film 110 is not formed, and are regions that are least rigid and most readily displaceable out of the unconstrained regions. The vicinity of the second end 110*b* of the piezoelectric element 108 has a large region that is readily displaced, corresponding to the distance L2, and accordingly the amount of displacement at the second end 110*b* side of the piezoelectric element 108 is even greater as compared to the amount of displacement at the first end 110*a* side. As a result, a great concentration of stress occurs at the end portion on the second end 110*b* side of the piezoelectric element 108, and the risk of description and separation of the piezoelectric element 108 becomes even higher. Even in such a configuration, according to the second embodiment, the sealing film 211 is provided over a great area in the proximity of the second end 110*b* of the piezoelectric element 108, and accordingly damage suppression effects of the piezoelectric element 108 can be effectively obtained, and the risk of damage to the piezoelectric element 108 is reduced. That is to say, in a configuration in which the distance L2 is greater than the distance L1, setting the distance d1 to be no less than the distance d2, and forming the recessed portion 211*a* so as to have a shape such as illustrated in FIG. 8A is particularly effective in reducing the risk of damage to the piezoelectric element 108. Also, such a configuration is also effective in a case in which the constraining regions of the diaphragm 109 are formed by other than joining of the first channel substrate 105 and the second channel substrate 106.

In order to confirm effects of the configuration according to the second embodiment, a high-temperature high-voltage bias test was performed to evaluate the durability of the liquid discharging head unit provided with the element substrate 10 according to the second embodiment. Specifically, under an environment of temperature of 85° C. and humidity of 85%, DC voltage of 60 V was applied to drive the actuator 121, which was maintained for 200 hours. Thereafter, the state of the piezoelectric element 108 was confirmed, in which no destruction or separation of the piezoelectric element 108 was found despite the higher risk of description and separation, and it was confirmed that a normal state had been maintained. From the above, according to the configuration of the second embodiment, damage suppression effects of the piezoelectric element 108 can be improved even further as compared to the configuration of the first embodiment.

Note that while one recessed portion 211*a* is formed corresponding to each piezoelectric element 108 in the above-described embodiments, the recessed portion 211*a* may be formed divided into a plurality of regions. Also, the shape of the recessed portion 211*a* is not limited to being rectangular, and may be an ellipse or an oval, for example. That is to say, the configuration of the recessed portion 211*a*, such as shape, film thickness, and so forth, can be changed as appropriate in accordance with configurations of other members, and so forth.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-129181, filed on Aug. 8, 2023, which is hereby incorporated by reference herein in its entirety.

What is claimed is:

1. An actuator, comprising:

a diaphragm that has a first face and that is provided to be capable of vibrating;

a piezoelectric element that includes a first electrode layer that is in contact with the first face, a second electrode layer, and a piezoelectric layer that has a first end in a first direction parallel to the first face and a second end on an opposite side to the first end, the piezoelectric element being provided on the first face, with the first electrode layer, the piezoelectric layer, and the second electrode layer being stacked in that order in a second direction perpendicular to the first face;

an electrode member that is connected to the second electrode layer at the first end side of the piezoelectric layer; and a sealing film that covers at least part of the piezoelectric element, and in which a recessed portion that is recessed in the second direction is formed between the first end and the second end, the sealing film covering the electrode member, wherein, in the first direction, a distance from the second end of the piezoelectric layer to an end of the recessed portion on the second end side is longer than a distance from the first end of the piezoelectric layer to an end of the recessed portion on the first end side.

2. The actuator according to claim 1, wherein the first direction is a direction parallel to a longitudinal direction of the piezoelectric element.

3. The actuator according to claim 1, further comprising:

a wiring member that is connected to the electrode member, the wiring member being disposed at a position overlapping an end portion at the first end side of the piezoelectric layer as viewed from the second direction.

4. The actuator according to claim 3, wherein a material and a thickness in the second direction are the same for the electrode member and the wiring member.

5. The actuator according to claim 1, wherein the distance from the second end of the piezoelectric layer to the end of the recessed portion on the second end side is a length that is 1.5 to 2.5 times the distance from the first end of the piezoelectric layer to the end of the recessed portion on the first end side.

6. The actuator according to claim 1, further comprising:

a second electrode member that, with the electrode member being a first electrode member, is connected to the first electrode layer, wherein the first electrode layer has an extension region that protrudes extending from the second end of the piezoelectric layer in the first direction, and the second electrode member is connected to the first electrode layer in the extension region.

7. The actuator according to claim 6, wherein both end portions of the diaphragm in the first direction are constraining regions that are constrained such that vibration is suppressed, and a wiring member connected to the first electrode member or the second electrode member is disposed at a position that does not overlap the constraining regions as viewed from the second direction.

8. The actuator according to claim 1, wherein an end portion of the diaphragm at the first end side in the first direction is a first constraining region that is constrained such that vibration is suppressed, an end portion of the diaphragm at the second end side in the first direction is a second constraining region that is constrained such that vibration is suppressed, and in the first direction, a distance from an end at a side of the second constraining region close to the second end, to the second end of the piezoelectric layer, is longer than a distance from an end at a side of the first constraining region close to the first end, to the first end of the piezoelectric layer.

9. The actuator according to claim 1, wherein the recessed portion is rectangular as viewed from the second direction.

10. The actuator according to claim 1, wherein a width of the recessed portion in a third direction that is orthogonal to the first direction and the second direction has a portion that becomes smaller toward the second end side.

11. The actuator according to claim 1, wherein the recessed portion is a portion in which a thickness is thinner as compared to other portions.

12. The actuator according to claim 1, wherein the recessed portion is a portion in which the sealing film is completely removed opening.

13. The actuator according to claim 1, wherein a Young's modulus of the sealing film is greater than a Young's modulus of the electrode member.

14. An element substrate, comprising:

a first channel substrate having a discharge orifice for discharging a liquid; and a second channel substrate having an actuator disposed at a position overlapping the discharge orifice as viewed from a second direction, the actuator including:

a diaphragm that has a first face and that is provided to be capable of vibrating, a piezoelectric element that includes a first electrode layer that is in contact with the first face, a second electrode layer, and a piezoelectric layer that has a first end in a first direction parallel to the first face and a second end on an opposite side to the first end, the piezoelectric element being provided on the first face, with the first electrode layer, the piezoelectric layer, and the second electrode layer being stacked in that order in a second direction perpendicular to the first face;

an electrode member that is connected to the second electrode layer at the first end side of the piezoelectric layer, and a sealing film that covers at least part of the piezoelectric element, and in which a recessed portion that is recessed in the second direction is formed between the first end and the second end, the sealing film covering the electrode member, wherein, in the first direction, a distance from the second end of the piezoelectric layer to an end of the recessed portion on the second end side is longer than a distance from the first end of the piezoelectric layer to an end of the recessed portion on the first end side.

15. A liquid discharging head discharging a liquid from a discharge orifice by an actuator being driven by voltage being applied to a first electrode layer and a second electrode layer, the liquid discharging head comprising:

a first channel substrate having a discharge orifice for discharging a liquid is formed; and a second channel substrate having an actuator disposed at a position overlapping the discharge orifice as viewed from a second direction, the actuator including a diaphragm that has a first face and that is provided to be capable of vibrating;

a piezoelectric element that includes the first electrode layer that is in contact with the first face, the second electrode layer, and a piezoelectric layer that has a first end in a first direction parallel to the first face and a second end on an opposite side to the first end, the piezoelectric element being provided on the first face, with the first electrode layer, the piezoelectric layer, and the second electrode layer being stacked in that order in a second direction perpendicular to the first face;

an electrode member that is connected to the second electrode layer at the first end side of the piezoelectric layer, and a sealing film that covers at least part of the piezoelectric element, and in which a recessed portion that is recessed in the second direction is formed between the first end and the second end, the sealing film covering the electrode member, wherein, in the first direction, a distance from the second end of the piezoelectric layer to an end of the recessed portion on the second end side is longer than a distance from the first end of the piezoelectric layer to an end of the recessed portion on the first end side.

* * * * *